United States Patent [19]

Schrank et al.

[11] 4,048,347
[45] Sept. 13, 1977

[54] METHOD OF COATING LAMP ENVELOPE WITH HEAT REFLECTING FILTER

[75] Inventors: Martin P. Schrank, Ipswich; Richard M. Coppola, Beverly, both of Mass.

[73] Assignee: GTE Sylvania Incorporated, Danvers, Mass.

[21] Appl. No.: 744,556

[22] Filed: Nov. 24, 1976

Related U.S. Application Data

[63] Continuation-in-part of Ser. No. 603,415, Aug. 11, 1975, abandoned.

[51] Int. Cl.² .......................... B05D 5/06; B05D 1/36
[52] U.S. Cl. ............................................. 427/10; 427/8
[58] Field of Search ................... 427/8, 9, 10, 42, 49, 427/50

[56] References Cited

U.S. PATENT DOCUMENTS

| | | | |
|---|---|---|---|
| 2,784,115 | 3/1957 | Brinsmaid et al. | 427/166 |
| 2,920,002 | 1/1960 | Auwarter | 427/166 |
| 3,188,513 | 6/1965 | Hansler | 313/112 |
| 3,225,243 | 12/1965 | Dauser | 313/112 |
| 3,637,294 | 1/1972 | Berthold | 350/166 |
| 3,650,815 | 3/1972 | Ghoshtagore et al. | 423/613 |
| 3,752,691 | 8/1973 | Little | 427/248 G |
| 3,926,508 | 12/1975 | Harmsen et al. | 350/166 |

*Primary Examiner*—James R. Hoffman
*Attorney, Agent, or Firm*—James Theodosopoulos

[57] ABSTRACT

A dichroic coating is deposited on a cylindrical lamp envelope from an evaporation source while the envelope is heated and rotated. The thickness of the coating is monitored by measuring the intensity of light beamed on and reflected from a flat plate in line of sight with the evaporation source.

2 Claims, 1 Drawing Figure

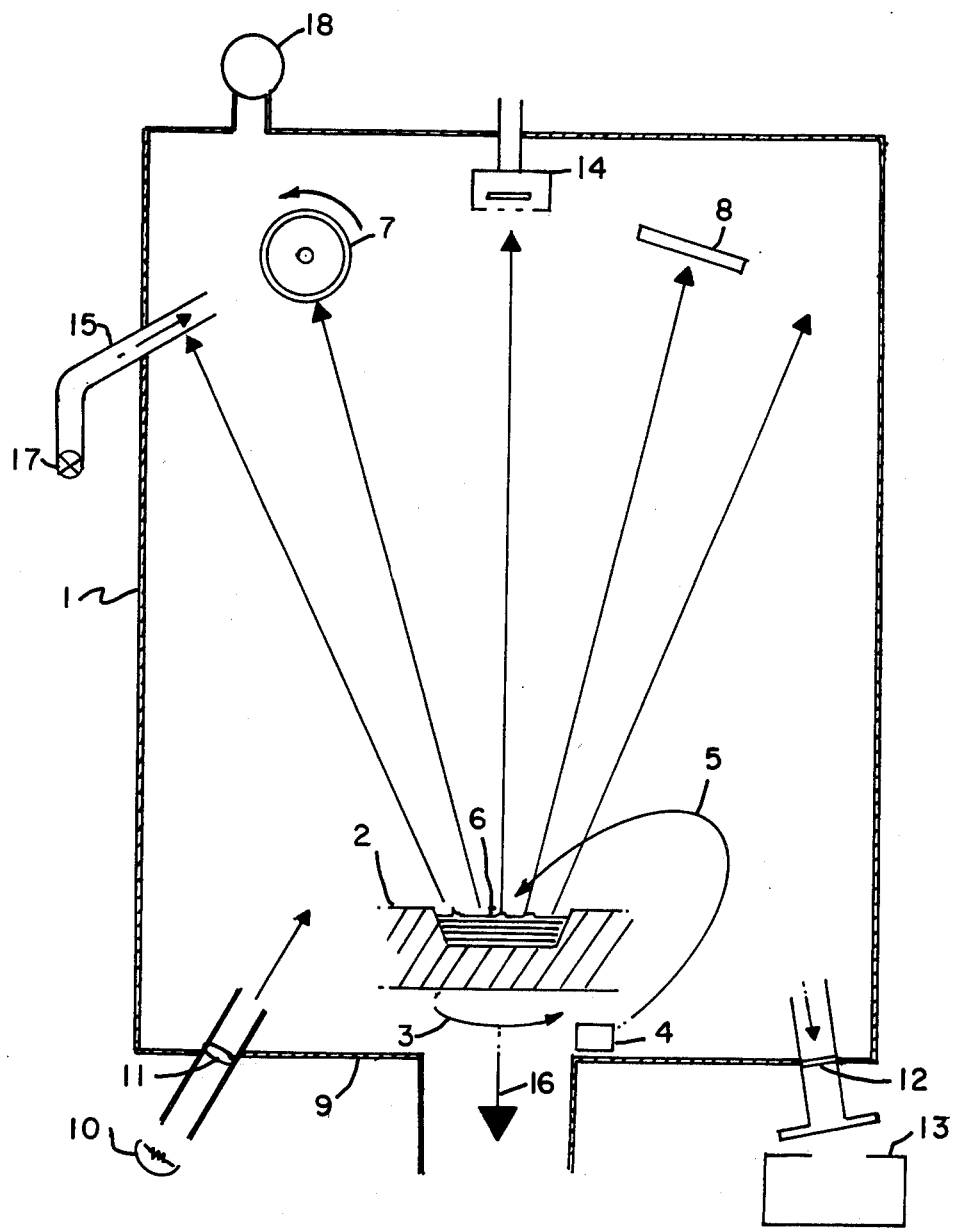

METHOD OF COATING LAMP ENVELOPE WITH HEAT REFLECTING FILTER

THE INVENTION

This application is a continuation-in-part of Ser. No. 603,415, filed Aug. 11, 1975, now abandoned.

This invention concerns the deposition of heat reflecting filters, specifically, dichroic coatings, on tubular glass, for example, the glass envelopes of electric lamps. The purpose of such a coating is to reflect infrared radiation while efficiently transmitting visible light, thereby improving lamp efficiency.

The method requires a suitable bell jar capable of being evacuated to a vacuum of at least about $10^{-6}$ torr. An example of such a bell jar is shown in U.S. Pat. No. 2,338,234. Disposed within the bell jar are sources of high refractive index material and low refractive index material capable of being heated to their evaporation temperatures. Within the bell jar and in line of sight with the evaporating source is a rotatable mount for the article to be coated and means for heating the article. Also required are a means for measuring the thickness of the material being deposited.

The FIGURE in the drawing is a diagrammatic representation of apparatus for practicing this invention.

In one specific embodiment the material to be deposited, namely, $SiO_2$ and $TiO_2$, are contained in separate crucibles mounted on a small turntable located in the lower part of a bell jar 1. The drawing shows a crucible 2 in position and arrow 3 indicates the direction of rotation of the turntable. Disposed within bell jar 1, somewhat below the turntable, is an electron beam generator 4. Magnets within the bell jar deflect the electron beam 5 into a circular path so that it impinges onto the upper surface of the material 6 to be evaporated. The turntable can be manually rotated from outside the bell jar so as to place either the silica or the titania in the path of electron beam 5.

Lamp 7 that was coated, a 120 volt 500 watt T3 double ended type FCL, was mounted in a rotatable mount in the upper part of the bell jar and rotated at 20 RPM during deposition. The rotatable mount comprised a stainless steel tubular fixture, into which one end of the lamp was inserted and secured, coupled by an electrically insulating plastic bushing to a drive shaft which was carried via a magnetically rotating feed through the base plate of the bell jar vacuum system and was then coupled to an electric motor. The lamp was heated, during deposition, by passing electric current through its filament by means of suitable spring loaded electrical contacts at the ends of the rotating lamp. 80 volts was sufficient to heat the lamp envelope to at least about 300° C.

In order to monitor coating thickness during deposition, a thin glass plate 8 was mounted in the upper part of bell jar 1 with a flat side normal to the direction to crucible 2. Below base plate 9 of the vacuum system was a light source 10 which beamed light onto glass plate 8 through a glass window 11 in the base plate. Some of this light was reflected from glass plate 8 through another glass window 12 and a filter in the base plate to a photocell system 13 capable of measuring the intensity of the reflected light. For a particular wavelength, the intensity of reflected light becomes a maximum when the deposit on glass plate 8 attains a quarter wavelength in thickness. Thus, by calculating the ratio of the deposition rate on rotating lamp 7 versus that on glass plate 8, monitoring of deposit thickness on rotating lamp 7 is accomplished by monitoring the deposit thickness on glass plate 8.

The coating thickness can also be monitored by means of crystal monitor 14. Monitor 14 is, for example, a quartz crystal the resonant frequency of which changes in known manner in accordance with the deposit thickness thereon.

The background pressure in bell jar 1 is indicated by pressure gauge 18 and is maintained at less than $5 \times 10^{-6}$ torr by means of suitable vacuum pumps; arrow 16 indicates the direction of evacuation. In addition a dynamic pressure of $1 \times 10^{-4}$ torr oxygen is maintained, during deposition, by means of a valve 17 and inlet 15 proximate lamp 7. The purpose of the oxygen is to ensure the formation of $TiO_2$ and $SiO_2$ on the lamp surface, since the titania and silica partially decompose during evaporation. And the reason for maintaining the lamp envelope at a temperature of at least about 300° C during deposition is to ensure that the rutile structure of $TiO_2$ is formed instead of the low temperature anatase structure. The rutile form is more abrasion resistant than the anatase and, desirably, has a higher index of refraction.

The thickness of coating deposited on lamp 7 is monitored in the following manner. The ratio of deposition thickness on plate 8 to that on lamp 7 is determined for a particular speed of rotation of the lamp, say, 20 RPM, and for a particular outer lamp diameter, say, three-eighths inch, and for a particular filament voltage, say, 80 volts. This is done by depositing on both for a time, determining the thickness on plate 8 and then removing lamp 7 from the chamber, removing a small section therefrom, and measuring the thickness of deposit thereon by a spectrophotometric scan. The thickness of the deposit on plate 8 is determinable because the deposit thickness affects the intensity of reflected light measured by photocell system 13. At a quarter wave thickness, the intensity reaches a maximum; at a half wave thickness, it becomes a minimum. And at three-quarter wave thickness, it reaches a maximum again, etc. By recording the output of photocell system 13 on graph paper, the number of quarter waves deposited on plate 8 is readily determinable. Thus, after several trials, it was determined that the above mentioned ratio was 4 ¾ to 1, that is to say, in order to deposit one quarter-wave on lamp 7, 4 ¾ quarter waves were required to be deposited on plate 8.

Thus, in the previously mentioned example, where 9 layers were deposited on lamp 7, the first and last layers being $SiO_2$ one-eighth wavelength thick and the remaining seven layers being alternate quarter-waves of $TiO_2$ and $SiO_2$, deposition was commenced while the intensity of reflected light from plate 8 as measured by photocell system 13 was being recorded. When 2 ⅜ quarter-waves had been deposited on plate 8, one eighth-wave had been deposited on lamp 7 and the power to electron beam generator 4 was then shut off. The 2 ⅜ quarter-waves were determined as follows: the distance between minimum and maximum intensity of reflected light from plate 8 on the graph paper was eight inches. Thus, 2 ⅜ quarter-waves had been deposited on plate 8 when the reflected intensity as shown on the graph paper had passed through a first maximum, then a first minimum and was then 3 inches into the second maximum.

In order to now apply one quarter-wave of $TiO_2$ on top of the eighth-wave of $SiO_2$, it was necessary to deposit 4 ¾ waves on plate 8. This could have been determined by adding 4 ¾ to the 2 ⅜ quarter-waves already deposited on plate 8 and terminating deposition when the total number of quarter-waves on plate 8 reached 7 1/8. We found it more convenient, however, to use a plate 8 in the form of a disc that could be rotated from outside of bell jar 1, the major part of the disc being masked and only a small part of the disc being used to measure thickness. Thus, after the eighth-wave of $SiO_2$ had been deposited on lamp 7, the disc was rotated and a fresh surface presented for deposition. When 4 ¾ quarter-waves of $TiO_2$ were deposited on this fresh surface, this equaled one quarter-wave deposited at the same time on lamp 7. For the next quarter-wave of $SiO_2$, another disc fresh surface was used. The process was repeated until deposition of the dichroic coating was complete.

In the previously mentioned example, a total of 9 layers was deposited on the lamp envelope. The first and last layers were $SiO_2$, one-eighth wavelength thick, and the remaining seven layers were alternately $TiO_2$ and $SiO_2$, one-fourth wavelength thick. About 5 minutes deposition time was required for each quarter-wave layer.

Twelve FCL lamps were measured for efficiency at rated wattage, then coated as described above, and remeasured. The efficiency of the uncoated lamps varied from 18.09 to 20.31 lumens per watt and the efficiency of the coated lamps varied from 21.1 to 24.1 lumens per watt. The efficiency gain varied from 9.7% to 19.3% and averaged 15.1% for the twelve lamps.

We claim:
1. The method of depositing a dichroic coating on the tubular envelope of an incandescent lamp comprising the steps of disposing said envelope in an evacuable bell jar and in line of sight with an evaposating source therein; evacuating said bell jar; heating and rotating said envelope while two different materials are alternately evaporated and deposited on the envelope, the envelope being heated during deposition to a temperature of at least about 300° C by energizing the lamp filament; and monitoring the thickness of said coating by beaming light on a plate located in the bell jar in line of sight with the evaporating source, recording the intensity of light reflected from said plate, determining the thickness of coating on said plate by means of said intensity of reflected light and multiplying said thickness of coating on said plate by a predetermined ratio to determine the coating thickness on said envelope.

2. The method of claim 1 wherein the dichroic coating comprises $TiO_2$ and $SiO_2$ and oxygen is admitted to the bell jar during deposition.

* * * * *